United States Patent [19]
Roch

[11] Patent Number: 5,344,238
[45] Date of Patent: Sep. 6, 1994

[54] BALL BEARING ASSEMBLY

[75] Inventor: Jaques L. Roch, Mountain View, Calif.

[73] Assignee: Electroglas, Inc., Santa Clara, Calif.

[21] Appl. No.: 992,994

[22] Filed: Dec. 18, 1992

[51] Int. Cl.$^5$ ............................................. F16C 29/04
[52] U.S. Cl. ..................................... 384/49; 384/905
[58] Field of Search ................. 384/30, 49, 493, 557, 384/905

[56] References Cited

U.S. PATENT DOCUMENTS

| | | | |
|---|---|---|---|
| 3,688,592 | 9/1972 | Kopczynski | 384/49 X |
| 4,190,870 | 2/1980 | Avina et al. | 384/132 X |
| 4,523,863 | 6/1985 | Okoshi | 384/609 |
| 4,582,369 | 4/1986 | Itoh . | |
| 4,717,265 | 1/1988 | Shioda et al. | 384/49 |
| 4,722,617 | 2/1988 | Stella et al. | 384/523 |
| 4,742,883 | 5/1988 | Duffy | 180/148 |
| 4,907,897 | 3/1990 | Shirotori | 384/493 X |
| 5,051,002 | 9/1991 | Hanaway | 384/49 |
| 5,158,373 | 10/1992 | Hanaway | 384/49 |

Primary Examiner—Thomas R. Hannon
Attorney, Agent, or Firm—Blakely, Sokoloff, Taylor & Zafman

[57] ABSTRACT

The ball bearing assembly has a total stroke range comprising a first portion where a clearance fit is applied and a second range where an interference fit is applied. The interference stroke range is used to, for example, carry a platform where precise alignment is necessary, and deflections or other movement of the platform must be minimized. Use of the ball bearing assembly to carry a platform holding a semiconductor wafer to be probed is illustrated. After each wafer is probed, the ball cage is reset such that any migration of the ball cage is eliminated so that the clearance and interference stroke ranges return to predetermined values. Further provided are means for rotationally resetting the ball cage, providing for even wear over the entire surfaces of the shaft and housing in their working zones to increase the useful lifetime of the assembly. Also provided are means for maintaining a predetermined interference fit over an extended temperature range, even where the shaft and housing operate at different temperatures.

16 Claims, 12 Drawing Sheets

5,344,238

BALL BEARING ASSEMBLY

FIELD OF THE INVENTION

The present invention relates to ball bearings and more particularly to a ball bearing assembly for movement of a platform with minimum deflection under various conditions.

BACKGROUND OF THE INVENTION

Ball bearing assemblies are used to carry loads in a variety of applications. For example, such an assembly may be used to raise and lower (or move backward and forward) a platform or other structure, and/or to rotate the platform or other structure. Additionally, in some applications both the inner and outer raceways of the assembly move reciprocally. Numerous configurations of ball bearing assemblies for a wide variety of applications are known.

Referring to FIG. 1, ball bearing assembly 100 is shown. Ball bearing assembly 100 comprises shaft 101, ball cage 102 and housing 103. In assembly 100, shaft 101 moves in an up and down (Z) direction as shown by arrow 110. Shaft 101 is, for example, cylindrical, as is the inner surface of housing 103. Ball cage 102 is disposed in the annular space between shaft 101 and housing 103. Ball cage 102 retains a plurality of balls loosely in place circumferentially around the cage. In assembly 100, cage 102 holds 2 'rings' of balls, 105a and 105b. In each ring there may be any number of balls depending upon the dimensions of the components of the assembly and the required support. Additionally, more than the two rings 105a and 105b as shown in FIG. 1 may be employed. Also, it will be appreciated that the balls 105 do not necessarily need to be arranged in rings as shown. Rather, the position of the balls may be staggered, to provide maximum surface contact with the shaft 101. The Z movement means 107, which could be, for example, a lead screw, is used to move the shaft 101 up and down. At the top of shaft 101, platform 116 is shown. Platform 116 could be used, for example, to hold a semiconductor wafer upon which some operation is to be performed. For example, after the semiconductor die have been fabricated on the wafer, it is often required to probe each die, before the wafer is cut to produce chips to be packaged.

As shown in FIG. 1, the gap between shaft 101 and housing 103 is greater than the diameter of the balls 105. This is known as a clearance fit. The appropriate clearance fit is desirable because it allows the shaft to move within the housing 103 without undue wear. However, a problem arises in that unwanted motion of the shaft 101 can occur during use. Generally this motion is a tilting motion as shown by arrow 115. Because there is this unintended motion in the ball bearing assembly 100, it may be difficult to align precisely an object held on the platform to another object, for example, a semiconductor die to a probe. Additionally, even if alignment is completed, forces occurring during use may prevent the desired operation from being completed. For example, in the probing of a semiconductor wafer, when the outer edge of the wafer is probed a force shown as arrow 117 at the edge of the wafer is applied. When the force 117 is applied, the platform 116 will tilt down where this force is applied. Additionally, the force may also cause X, Y and rotational motion. These motions will reduce the probing accuracy and may prevent the probing of the die. The tilting motion will prevent some of the probes from accurately contacting the die, and the X, Y, and rotational motion will cause the die to be out of alignment with the probe tips as well.

FIG. 2A shows bearing assembly 200, which is one possible solution to this problem. In this case, balls 205 have a diameter that is greater than the annular space between shaft 201 and housing 203. In this case, the balls 205 penetrate, to some degree, both shaft 201 and housing 203. Additionally, the balls 205 deform slightly. This is known as an interference or preload fit. In such a fit, the shaft is tightly held within the housing. Therefore maximum shaft stiffness is provided, which would minimize platform deflection under forces, such as force 117 of FIG. 1. In FIG. 2A, the platform 216 is in an up position. FIG. 2B shows assembly 200 in a down position. As can be seen from the figure, as the shaft 201 moves up and down, ball cage 202 with balls 205 moves up and down as well, due to the tight fit of the balls.

FIG. 2C shows a problem which occurs with such an arrangement over time. After many up and down motions ball cage 202 has a tendency to migrate in either an up or a down direction. In FIG. 2C ball cage 202 has migrated all the way to base 207. As shown, shaft 201 still has a distance 215 which it can travel in the downward direction. As shaft 201 moves down, ball cage 202 cannot move with it. Because this is an interference fit, balls 205 cannot roll as shaft 201 moves down. In some cases, this will prevent shaft 201 from moving downward. In other cases, the shaft 201 can still move, but the balls do not roll with it. Instead, the shaft 201 slides over the contact surface of the balls 205, with high friction. This results in increased wear of the shaft 201, the balls 205 and possibly the housing 203, and therefore a shorter life of or damage to the assembly 200. Because of this wear, manufacturers of ball bearing assemblies commonly recommend a clearance fit. Typically, there will also be some means (e.g., platform 116) for stopping ball cage 202 near the top of assembly 200, so that upward migration of ball cage 202 will cause the same problem as downward migration.

What is needed is a ball bearing assembly which suffers little or no deflection under the forces that occur during use. The assembly should prevent significant migration of the ball cage which leads to the problems described above. What is further needed is an assembly which allows for increased life by reducing wear of the parts. Any such assembly should also maintain these advantages over an extended temperature range of operation.

SUMMARY OF THE INVENTION

A preferred embodiment of the present invention comprises a ball bearing assembly having a total stroke range comprising a first stroke range wherein there is a clearance fit between the shaft and housing and a second stroke range wherein there is an interference fit. Means are provided for resetting the ball cage in relation to the shaft and housing such that the first and second stroke ranges are reset to predetermined distances. The present invention further provides for rotationally resetting the ball cage, such that wear of the parts is minimized. Also provided is a means for maintaining the design interference fit, over an extended temperature range, even when the shaft and housing operate at different temperatures.

Other features of the present invention will be obvious from the detailed description, claims, and drawings herein.

DETAILED DESCRIPTION OF THE PRESENT INVENTION

A ball bearing assembly is disclosed. In the following description, numerous specific details are set forth such as specific materials, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention. Additionally, the present invention is described in conjunction with its use in carrying a platform or chuck top which holds a semiconductor wafer to be probed. It will be understood that the present invention is not limited to the described use, that such use is only illustrative in order to aid in an understanding of the present invention, and that the invented ball bearing assembly may be used in many diverse applications.

Figure 3:
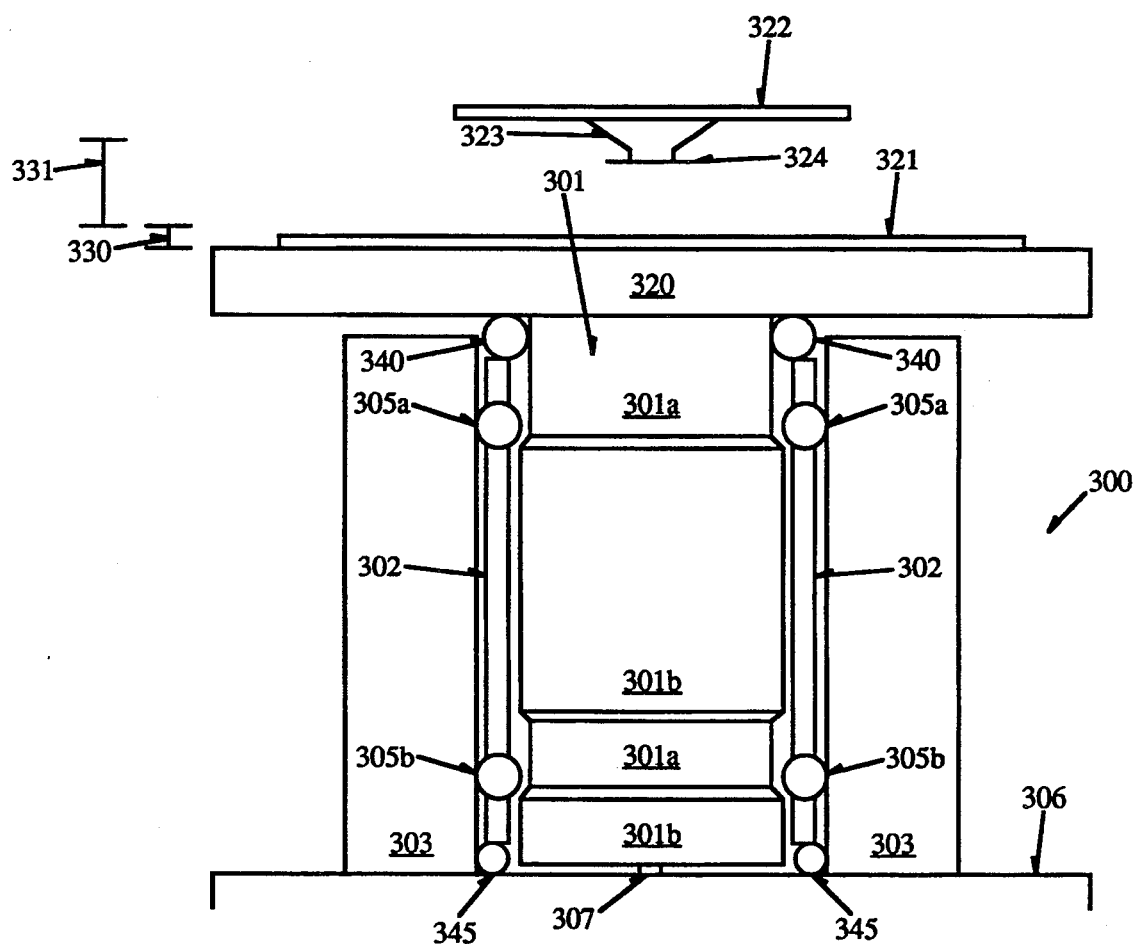
FIG. 3 shows currently preferred embodiment of a ball bearing assembly according to the present invention in a down position.

FIG. 3 shows a currently preferred embodiment of ball bearing assembly 300 of the present invention. Ball bearing assembly 300 comprises shaft 301, ball cage 302 and housing 303. Shaft 301 is generally cylindrical, as is the inner surface of housing 303. Ball cage 302 is also cylindrical, fitting in the annular space between shaft 301 and housing 303. Although a cylindrical shaft 301 and inner surface of the housing 303 is shown, it will be appreciated that the present invention can be practiced on ball bearing assemblies with other shapes, for example the shaft and housing could be square or rectangular, with balls in a ball retainer such as cage 302 placed on two or more sides. Such an embodiment will not have the rotational (theta) motion described herein.

As stated above, ball bearing assembly 300 is used to carry a platform which holds a semiconductor wafer in a currently preferred embodiment. Shown attached to shaft 301 is platform 320 with semiconductor wafer 321 placed thereon. Wafer 321 is typically held in place by vacuum. Shown above platform 320 is probe card 322 having probes 323. The tips of probes 323 lie generally in plane 324. The Z motion means 307, which could be, for example, a lead screw, move shaft 301 and the attached platform 320 in an up and down direction 315, to contact probes 323 at plane 324. In a currently preferred embodiment, the inside diameter of housing 303 is approximately 1.9973 inches. Ball cage 302 has an inner diameter of approximately 1.663 inches and an outer diameter of approximately 1.957 inches. Ball cage 302 comprises two rings of balls, 305a and 305b, arranged circumferentially around ball cage 302. Each ring comprises twenty such balls 305. The diameter of each ball 305 is approximately 3/16 of an inch (all balls 305 for a given assembly 300 are one size selected from the sizes 0.1874 inch, 0.1875 inch or 0.1876 inch as will be described below). As can be seen from FIG. 3, shaft 301 comprises two sections 301a, having a diameter of approximately 1.6216 inches, and two sections 301b having a diameter of approximately 1.6228 inches. As shown in the Figure, there is a taper or a lead between the two diameters at each interface. As will readily be appreciated, the above dimensions are simply for an illustrative embodiment of the present invention. It will readily be appreciated that numerous different configurations and dimensions may be employed, within the spirit and scope of the invention as described and claimed herein. As will be explained in more detail below, range 330 shows the clearance stroke range, and range 331 shows the interference stroke range, with reference to the top of platform 320.

Figure 4:
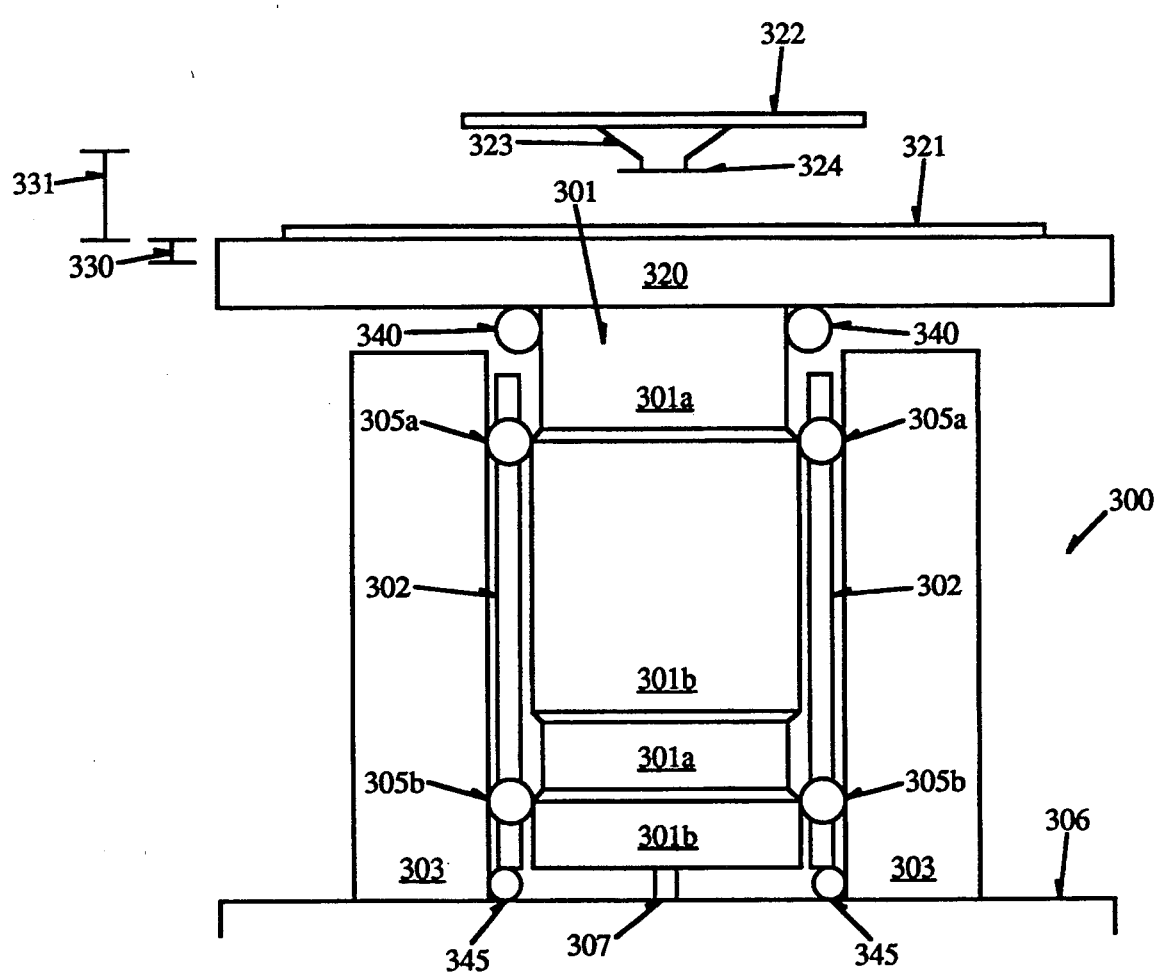
FIG. 4 shows a currently preferred embodiment of a ball bearing assembly according to the present invention in an intermediate position.

In FIG. 3, shaft 301 is near or at the bottom of its total stroke range, which extends from the bottom of range 330 to the top of range 331. At this position, as can be seen from the Figure, the ring of balls 305a and 305b, are at a position where the distance between the shaft 301 and the inner surface of housing 303 is wider than the diameter of the individual balls 305. That is, all balls 305 are located in a position such that they are adjacent to one of sections 301a. This will be the case so long as shaft 301 is positioned such that the top of platform 320 is within range 330. Referring now to FIG. 4, ball bearing assembly 300 is shown after shaft 301 has been raised by Z motion means 307 to the end of the clearance stroke range 330, and the beginning of the interference stroke range 331. As can be seen from FIG. 4, at this point both rings of balls 305a and 305b begin to engage sections 301b of shaft 301. At this point in the travel, all balls 305 are positioned such that the distance between the shaft 301 and the inner surface of housing 303 is less than the diameter of the balls 305. Therefore, at this point, ball bearing assembly 300 begins to have an interference fit. Thus, as the platform moves through distance 330, ball bearing assembly 300 is in a clearance stroke range. After the top of distance 330 is reached, as in FIG. 4, ball bearing assembly 300 is in an interference stroke range. In a currently preferred embodiment, the clearance stroke range 330 is approximately 0.170 inch and the interference stroke range is approximately 0.250 inch. These ranges can be varied as necessary to accomodate various probe cards. As will be readily appreciated, the ranges 330 and 331, as well as their relative position can be varied based upon the intended use of ball bearing assembly 300.

Figure 5A:
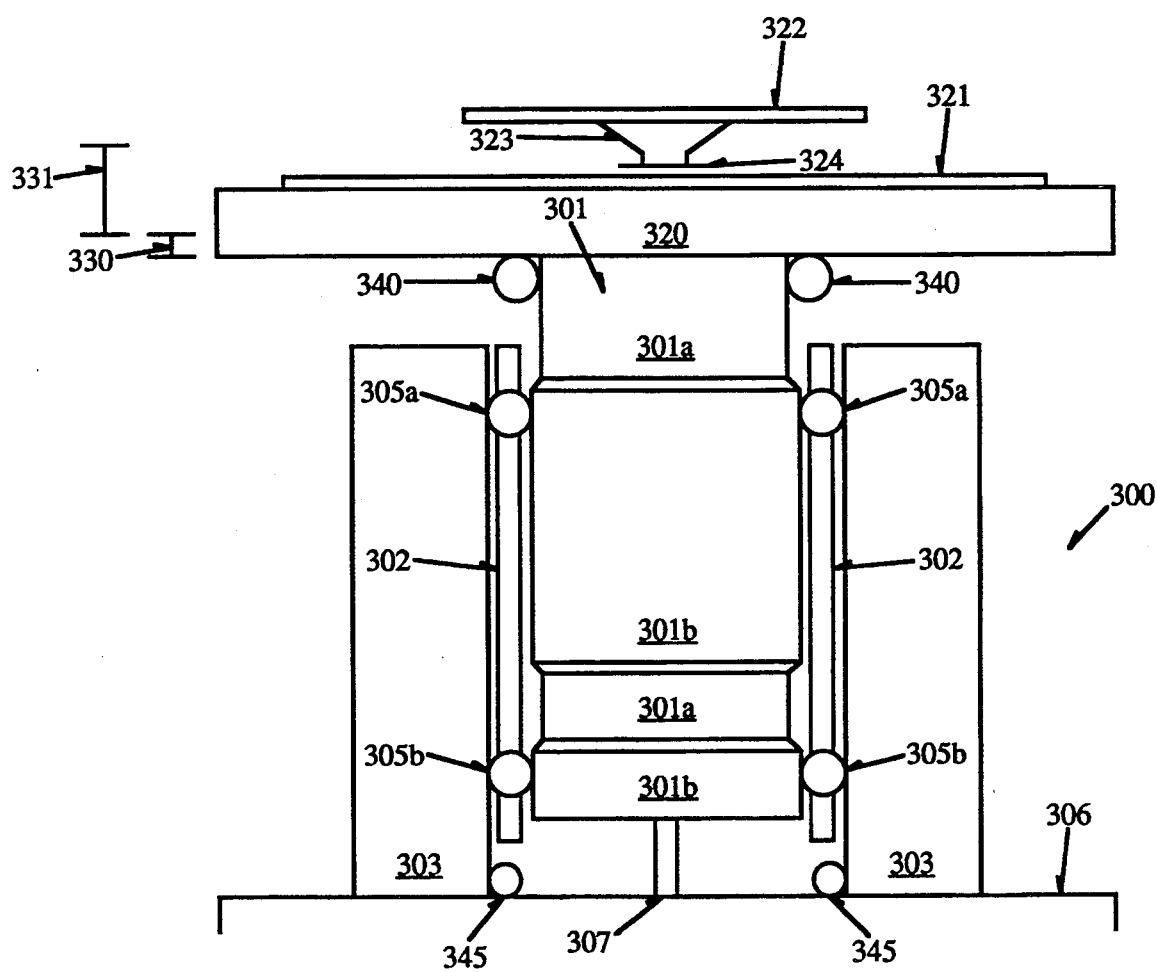
FIG. 5A shows a ball bearing assembly according to the present invention in a raised position.

Referring now to FIG. 5A, ball bearing assembly 300 is shown in a further raised position, just prior to contact with probes 323. Distance 331 shows the extent of interference stroke range 331. That is, so long as shaft 301 moves such that the top of platform 320 is within range 331, assembly 300 is in an interference range. As shown, this range extends from a distance below to a distance above the plane 324 of probes 323.

The operation of assembly 300 will now be described in conjunction with the probing of a semiconductor wafer. As mentioned previously, a semiconductor wafer consists of a plurality of die. Each typically has a plurality of bond pads, which provide for electrical contact to the circuits on the die. The probe card 322 has probes 323 which contact some or all of these bond pads, enabling the probes to send signals to and receive signals from the circuits on the die. Probes 323 provide the necessary supply voltages, connection to ground, control signals, etc., to allow the functionality of each die to be tested. Typically, several bond pads lie in a row across two sides of each die. Therefore, each of the two probes 323 shown in the figure represent a row of several such probes corresponding to the bond pads on the die. Alternatively, the die may have bond pads surrounding the perimeter of the die, and probe card 322 would contain additional probes 327 to contact these bond pads. Testing can be done at room temperature, as well as at lower and higher temperatures. To test at these temperatures, a platform 320 having a heating/cooling device therein is utilized. In one embodiment, the wafer 321 can be heated to temperatures of approximately 200° C. or higher, or can be cooled to temperatures of approximately −65° C. or lower. The testing of die is well known in the semiconductor art. Assembly 300 must be able to position the platform 320 such that the bond pads on the die are precisely aligned to the probes 323 in plane 324. To accomplish this, assembly 300 must lift platform 320 and wafer 321 up to plane 324, such that the tips of probes 323 contact the bond pads with sufficient force to provide for electrical contact. In order to align the pads to the probes 323, X, Y and theta (rotational) adjustments must be made.

Figure 5B:
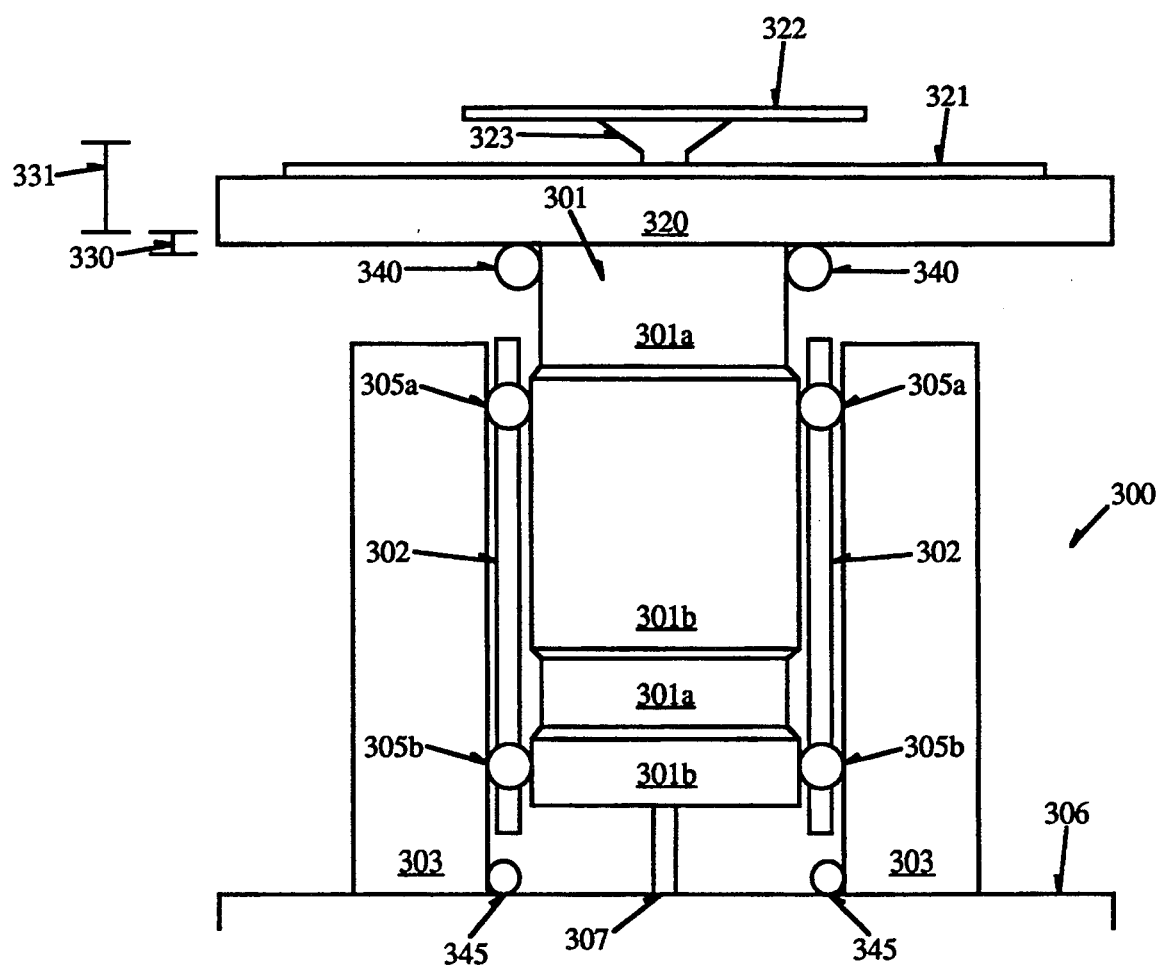
FIGS. 5B and 5C show a ball bearing assembly according to the present invention during the probing of a semiconductor wafer.
Figure 5C:
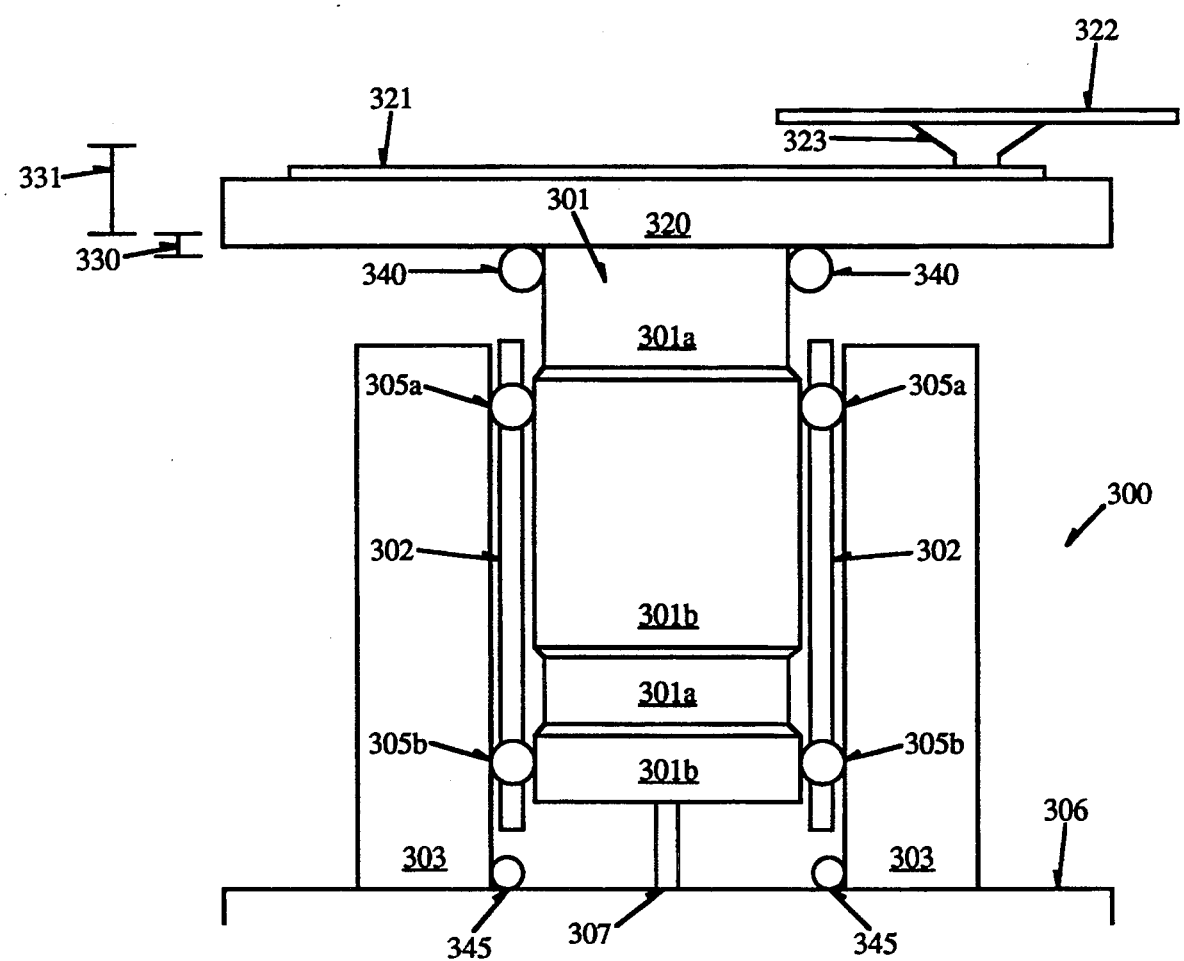

First, the wafer 321 is placed on platform 320 when platform 320 is in a down position such as that shown in FIG. 3. While FIG. 3 shows platform 320 in the fully down position, the wafer 321 can be placed on the platform in other positions, so long as there is sufficient clearance between the platform 320 and probes 323, as in a currently preferred embodiment. Generally, the wafer 321 is first prealigned by, for example, placing the flat in a predetermined location. After prealignment all that is needed is a slight X, Y and rotational adjustment. After loading the wafer 321 the platform 320 is moved up a distance. After the platform has gone through the clearance stroke range 330 and begins movement in interference stroke range 331 as shown in FIG. 4, the platform continues to rise until it is approximately in the position shown in FIG. 5A close to the plane 324 of the probes 323. At this time the tips of 323 probes are aligned to the bond pads of the first die to be tested. Generally, theta adjustment is accomplished by rotating the platform 320. X-Y adjustment is made by moving the platform 320 and assembly 300 on base 306, such that the probe tips are aligned to the first die to be probed. Alternatively, probe card 322 can be moved. After alignment to the first die, the platform is brought up further, i.e. shaft 300 is moved in an upward direction by Z travel means 307 such that the probe tips contact wafer 321 as shown in FIG. 5B. After a die has been probed, platform 320 and wafer 321 are brought down to approximately the position shown in FIG. 5A and base 306 with its bearing assembly 300 is moved such that probes 323 are in alignment with another die on the wafer. As is well known, the order of probing the die is arbitrary and can be specified by the user. Often, after a first die is aligned, the base 306 with bearing assembly 300 need only be moved a specified X and Y distance to the next die, with no further alignment needed. Once in alignment, platform 320 is brought back up such that wafer 321 is again in contact with probes 323 on the different die, for example, as shown in FIG. 5C.

Figure 1:
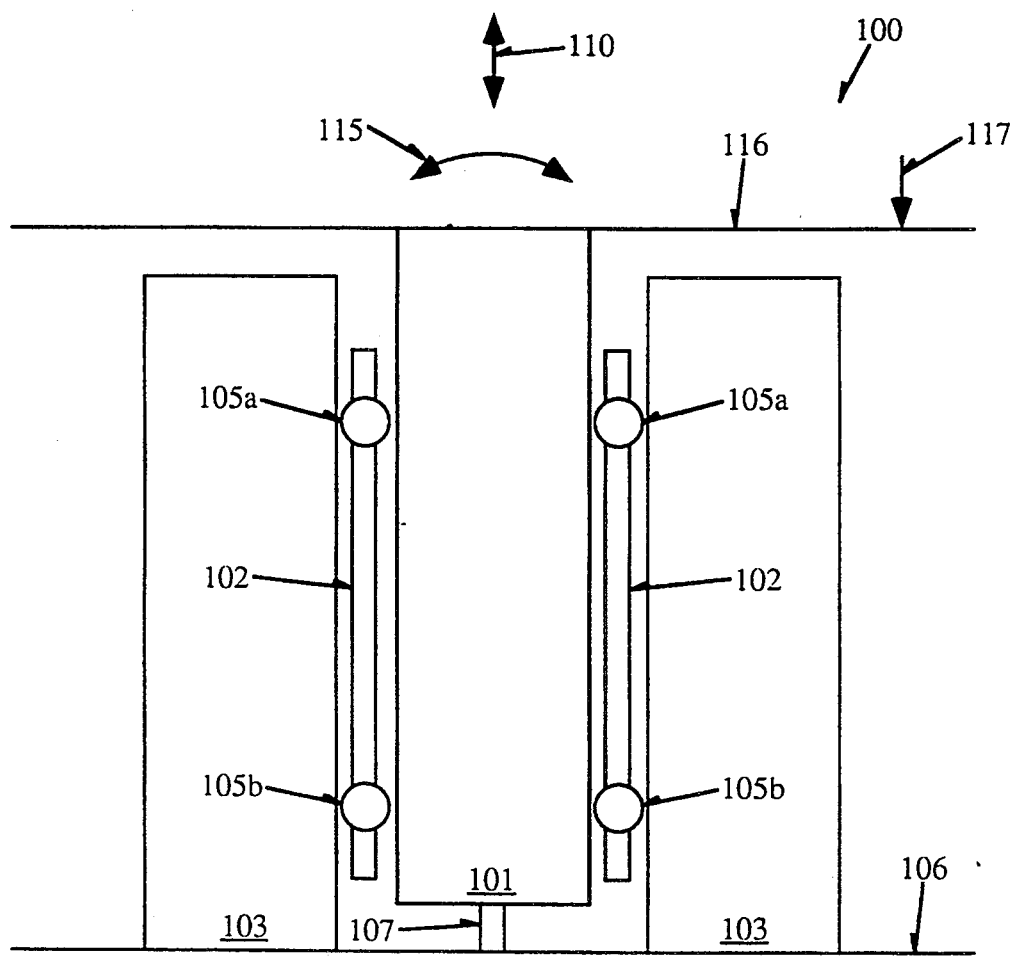
FIG. 1 shows a prior art ball bearing assembly with a clearance fit.

Note that after the wafer has been loaded, and the first die is brought up for alignment, all motion of the platform, for example rotationally or in the X, Y plane to align the die or to move to other die is done while assembly 300 is in the interference stroke zone. As mentioned earlier, in this range, maximum stiffness of the shaft is provided by the interference fit. Therefore very tight X, Y and rotational alignment control is possible. Additionally, once alignment is achieved, it is maintained during the probing operation, even when the probe tip is at the outer edge of the wafer, as shown in FIG. 5C, where the Z deflection force is at its greatest. Therefore, this stiffness prevents to a large degree the tilting discussed is relational to FIG. 1, so that the probes 323 can accurately contact the bond pads.

As mentioned previously, ball cages, such as ball cage 302 can migrate in one direction or another after repeated up-down travel. As described in the background section, after the ball cage has contacted a retainer, the shaft may be prevented from moving or will be forced to slide on the balls 305, thereby increasing wear with possible damage to the parts of the ball bearing assembly.

However, in the present invention the problem of ball cage migration is prevented by periodically resetting the ball bearing assembly 300. Typically, the migration occurring during a wafer probing operation is very minor. Thus, so long as the platform is reset after each wafer is probed, as described below, the above described problems will not occur in the present invention. If sufficient migration is found to occur during the probing of a single wafer the method described below can be performed as frequently as necessary. However, in most situations it will be found that resetting will not need to be performed any more frequently than once per wafer. Generally, the migration over time may be so slight that resetting is not needed every wafer. However, it will generally be most convenient to include a reset cycle between each wafer, as wafers are loaded and unloaded onto and from platform 320.

Figure 6:
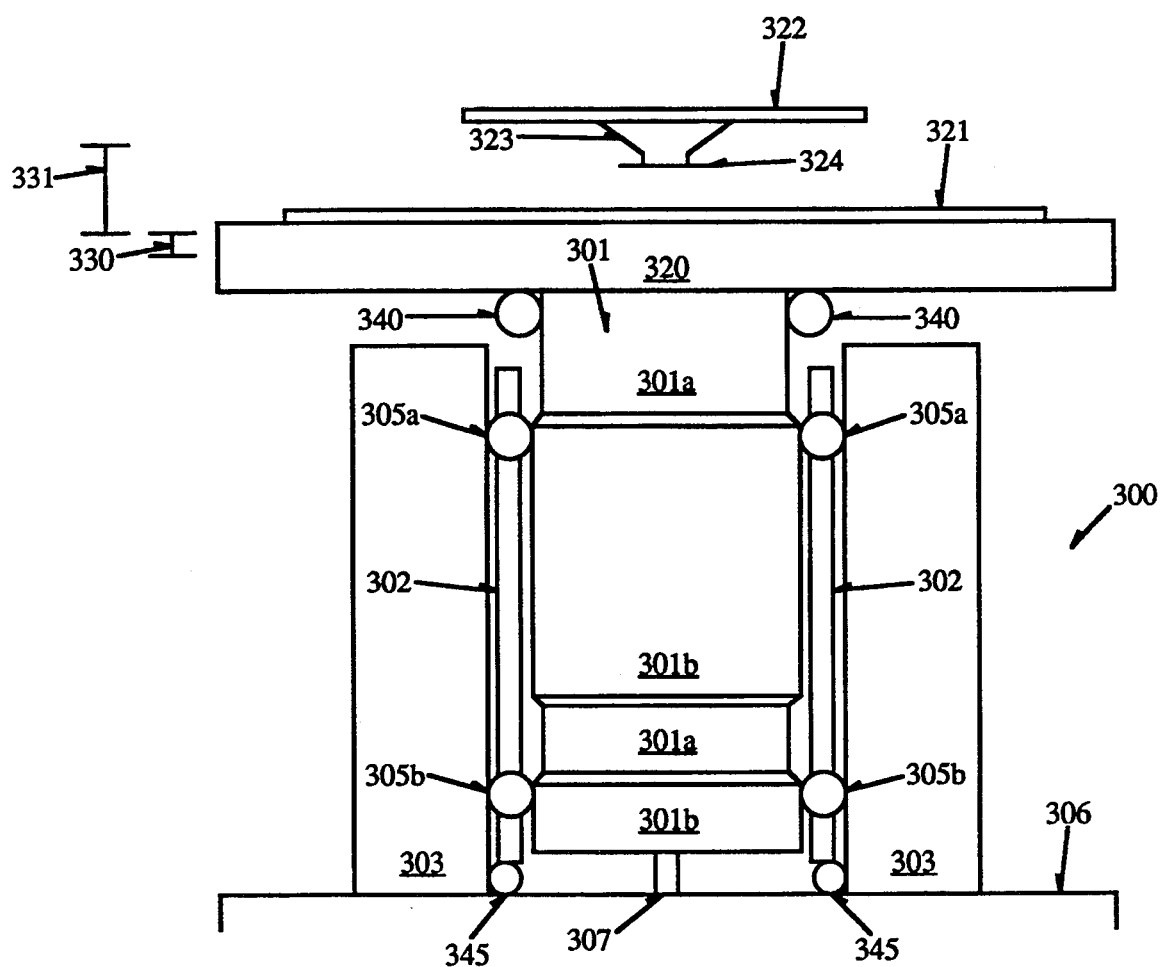
FIG. 6 shows a currently preferred embodiment of the present invention after the ball bearing cage has migrated downward.

Referring to FIG. 6, ball bearing assembly 300 is shown after a wafer has been probed and the shaft 301 has been brought part of the way down. In FIG. 6, there has been downward migration of the ball cage 302 during the probing of the wafer. Comparing FIG. 6 to FIG. 4, it can be seen that ball cage 302 is slightly lower in relation to the shaft in FIG. 6 than in FIG. 4. Specifically, as shaft 301 is moving down in FIG. 6, ball cage 302 is contacting O-ring 345 when shaft 301 is slightly above the position it was in when it was rising in FIG. 4. However, after reaching the position shown in FIG. 6, shaft 301 will continue its downward motion to the reset position. As the shaft 301 lowers, cage 302 and O-ring 345 will compress slightly, allowing balls 305 to continue to roll, so that shaft 301 is not forced to slide pass the balls 305. As shaft 301 goes below the position shown in FIG. 6, there will again be a clearance fit, and this compression will be released. In a currently preferred embodiment, O-ring 345 is Teflon ™ and ball cage 302 is plastic. These materials can readily compress a sufficient amount to absorb any downward migration that has occurred during the probing of a wafer, so that shaft 301 is never forced to slide past balls 305. Next, shaft 301 will continue its downward motion until it is as shown in FIG. 3. Thus, after shaft 301 is brought down, assembly 300 is reset to the position shown in FIG. 3. As described earlier, as shaft 301 is raised up it will again travel through the predefined clearance stroke range 330, and then again into the predefined interference stroke range 331. Therefore, when any downward migration occurs, the system will be reset such that clearance stroke range 330 and interference stroke range 331 are returned to their designed values.

Figure 7A:
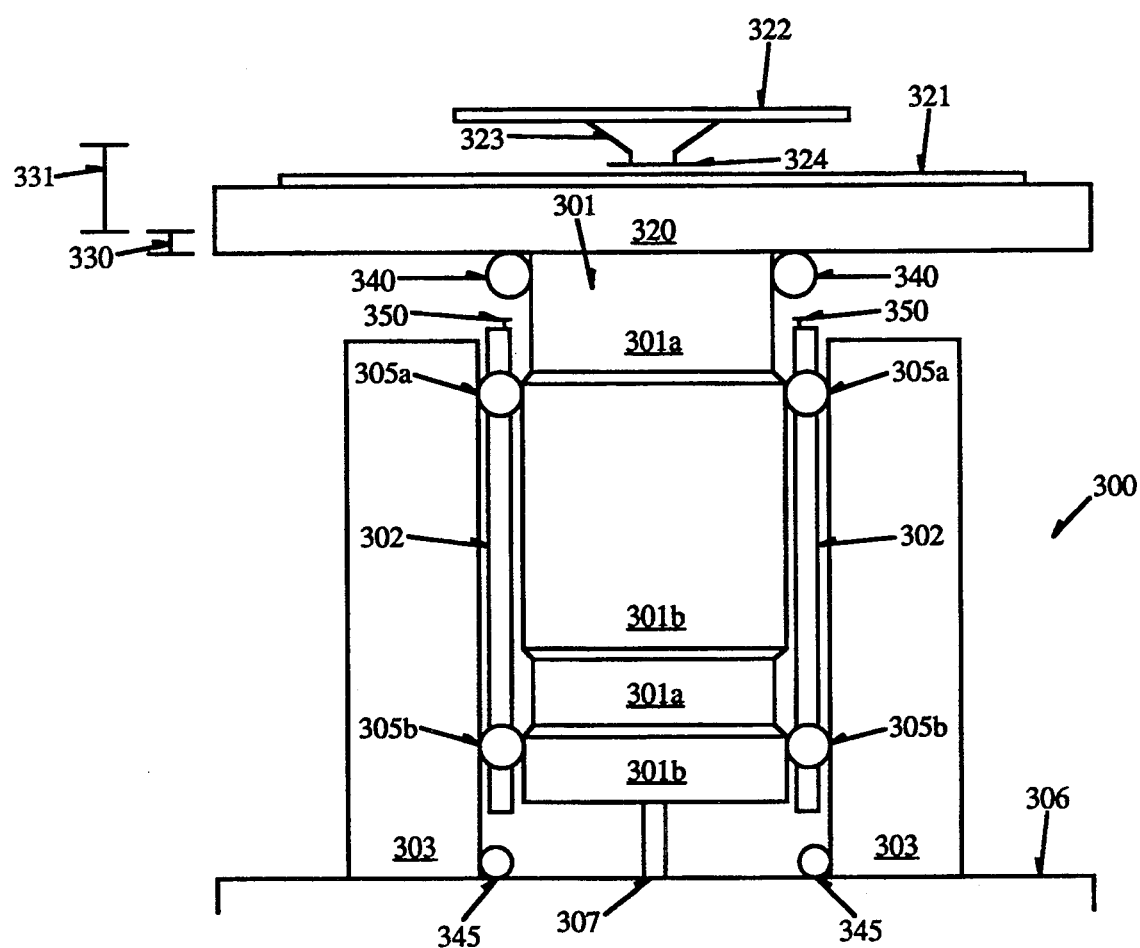
FIGS. 7A and 7B shows a currently preferred embodiment of the present invention after the ball bearing cage has migrated upward.
Figure 7B:
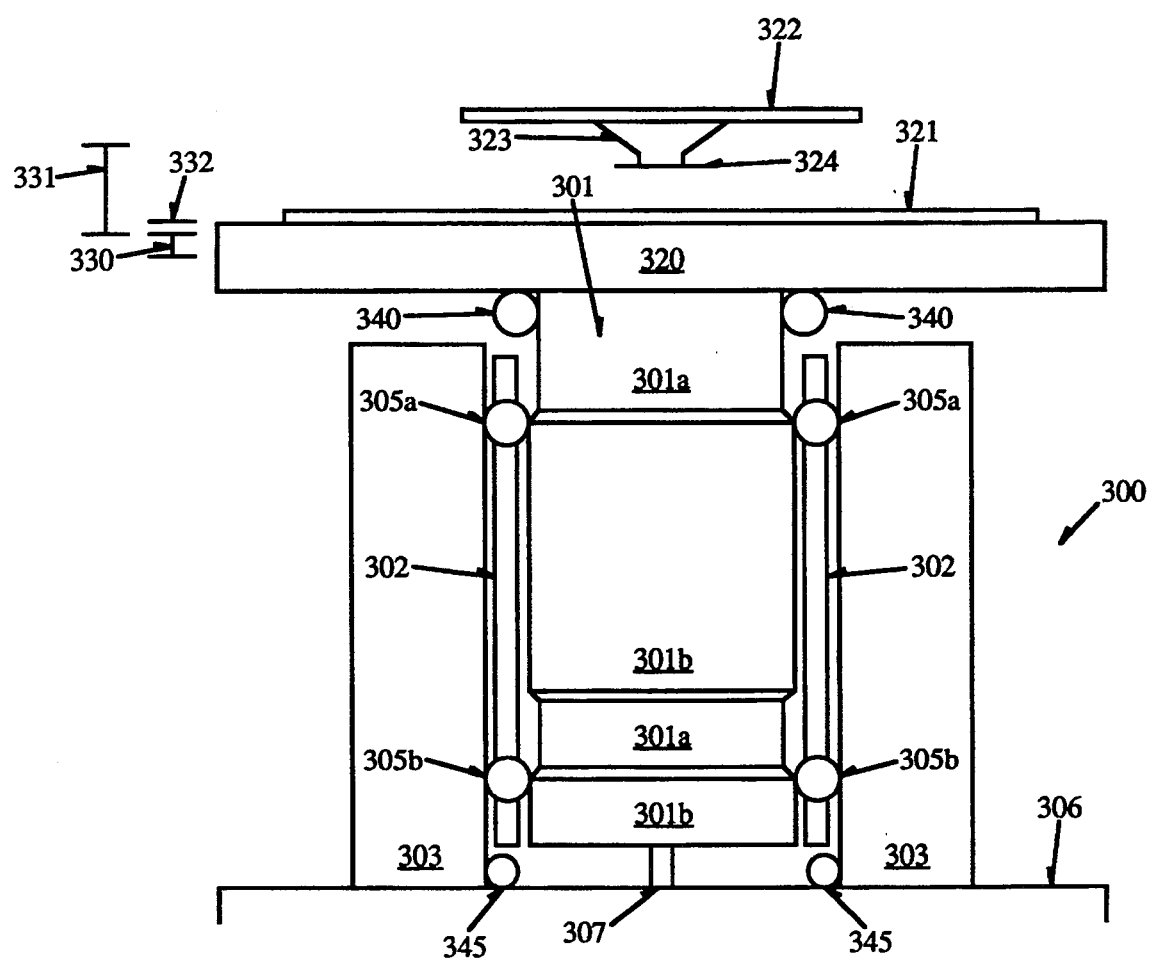

Referring now to FIG. 7A, as can be seen ball cage 302 has migrated to a slightly raised position compared with the corresponding probing positions shown in FIG. 5A. Again however, cage 302 is reset after each wafer. For example, if upward migration as shown in FIG. 7A occurred, the following would take place upon resetting. First shaft 301 and platform 320 would move downward. After this downward motion to slightly above the top of range 330, assembly 300 would be in a clearance fit. That is, the assembly 300 would reach a clearance fit when the top of platform 320 is approximately at the level 332 shown in FIG. 7B due to the upward migration. As shaft 301 continues to lower, cage 302 will lower with it, until cage 302 resets on O-ring 345. After cage 302 reaches O-ring 345, its downward motion will stop. Shaft 301 will continue its downward motion until it is in the position shown in FIG. 3. Note that as shaft 301 continues its downward motion after ball cage 302 has reached O-ring 345, it is not forced to slide on the balls since the balls are in a clearance fit and no load is applied on platform 320. Note that if for some reason ball cage 302 does not travel fully down with shaft 301, O-ring 340 will push it against O-ring 345 as assembly 300 resets to the position shown in FIG. 3. As can be seen from FIG. 3, the overall distance between compressed O-ring 340 and O-ring 345 is maintained, so that the ball cage 302 is always reset to the same position relative to the shaft and housing.

In the present invention, therefore, any slight upward or downward migration has no detrimental effect on the operation or wear of assembly 300. As described in relation to FIG. 6, the downward migration occurring during the probing of a single wafer is typically much less than the amount of compression available in O-ring 345 and ball cage 302. Therefore, harmful sliding of the shaft 301 over the balls 305 cannot occur. Referring back to FIG. 7B, it can be seen that with upward migration, the upper end of the clearance range 332 is well below the probing range shown in FIG. 5. Therefore, there will still be an interference fit, as described, in the probing range. It should be noted that the extent of migration shown in FIGS. 6 and 7 has been exaggerated in order to illustrate the present invention, and less migration than shown occurs during the probing of a wafer.

Referring back to FIG. 7A, rotational resetting will now be described. In the rotational resetting of ball bearing assembly 300, ball cage 302 is rotated a predetermined amount relative to shaft 301 and housing 303. In FIG. 7A, two screws 350 at the top of cage 302 are shown as part of ball cage 302. Screws 350 are present in the preferred embodiment of the invention. However for clarity, screws 350 are not shown in the other figures, but are understood to be present. Although a currently preferred embodiment utilizes two screws 350, it will be appreciated that any number of such screws 350 could be utilized. Additionally, other similar structures could be utilized in alternative embodiments. O-ring 340, which is attached to platform 320, is made of Buna-N rubber in a currently preferred embodiment. Because O-ring 340 is made of rubber, it is able to engage or "grab" screws 350, and therefore cage 302, securely.

Figure 2A:
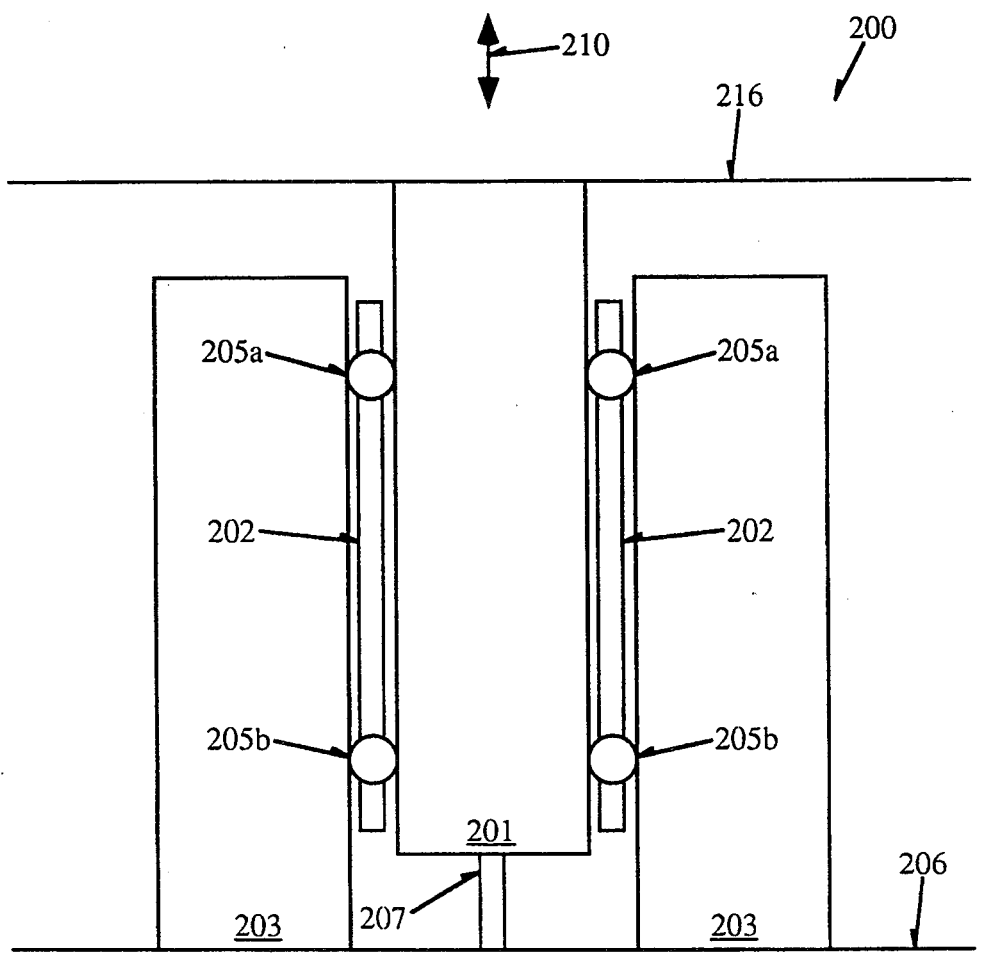
FIGS. 2A-2C show prior art ball bearing assemblies with an interference fit.
Figure 2B:
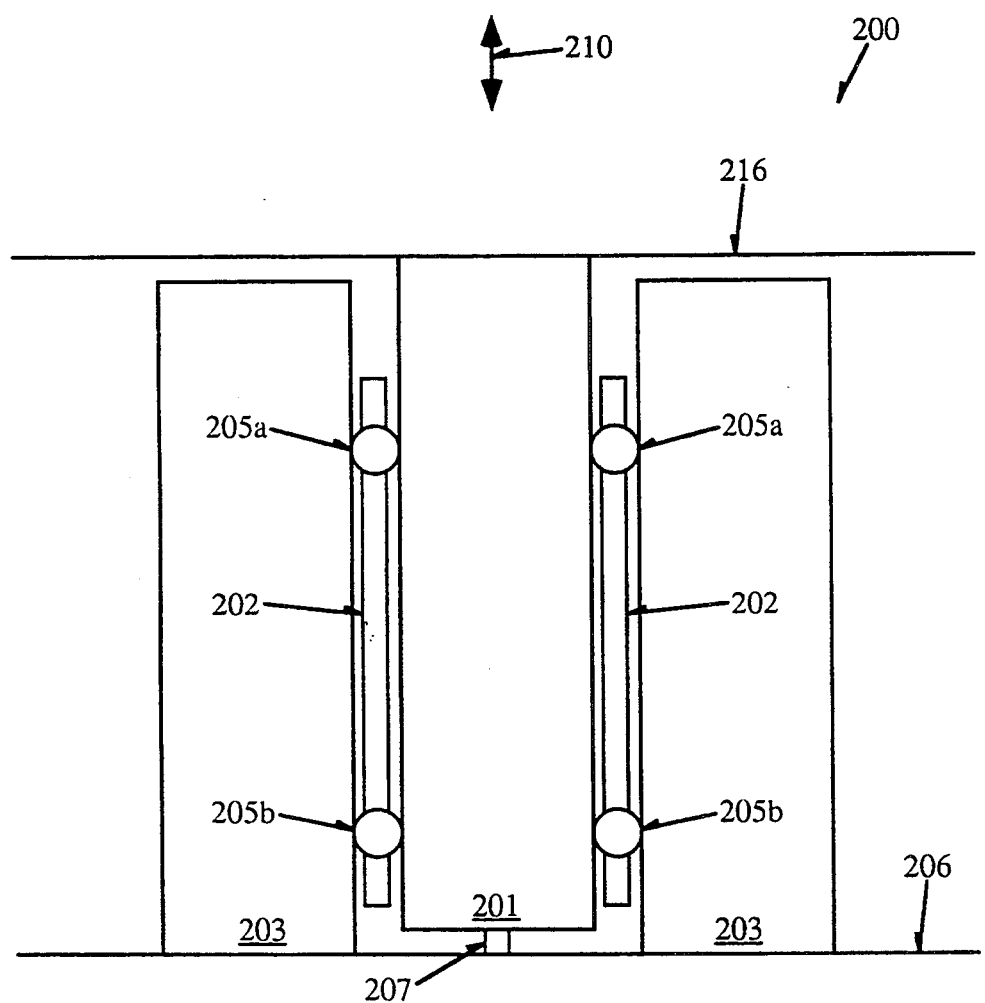
Figure 2C:
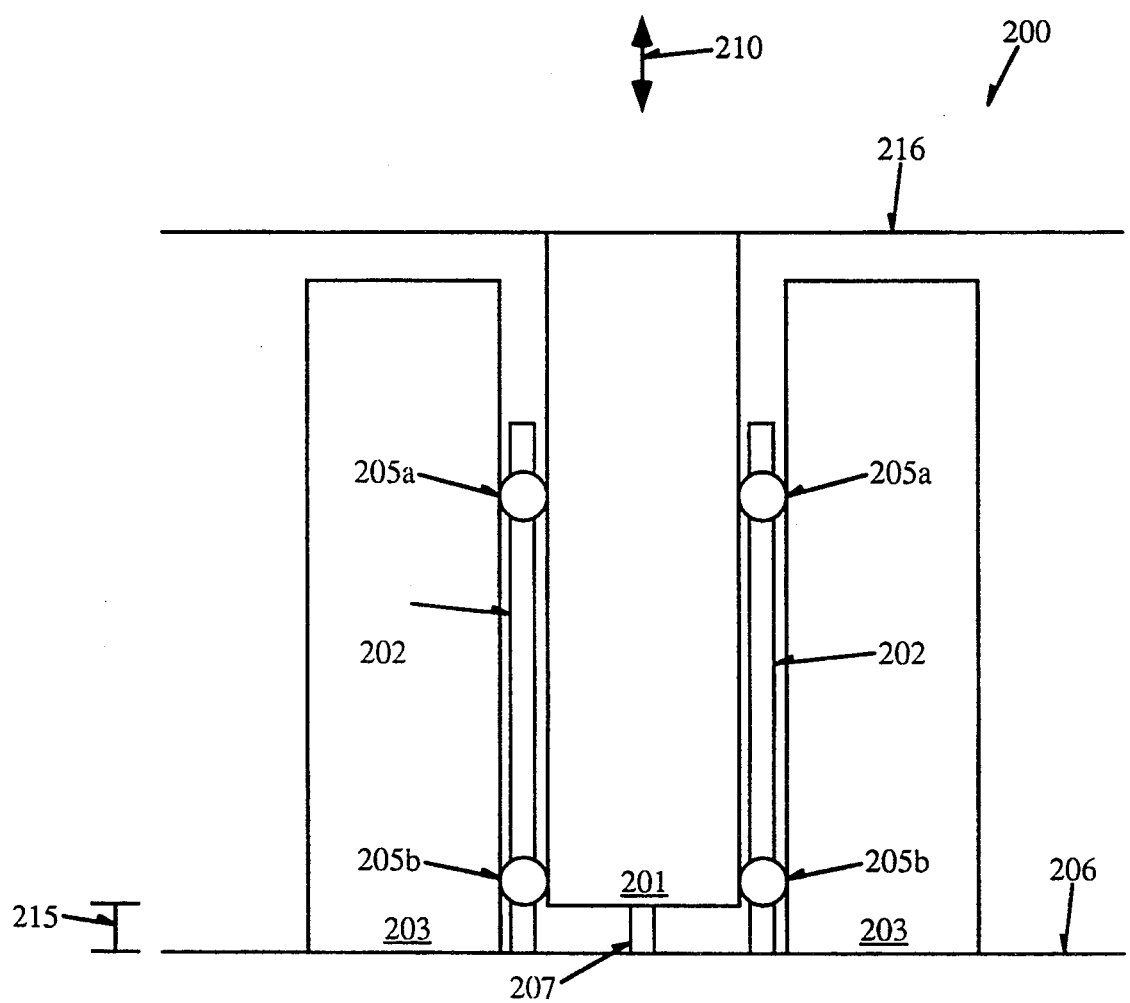

Referring now to FIG. 3, when assembly 300 is in the down position, cage 302 will move rotationally with platform 320 as O-ring 340 grabs screws 350. This rotational movement is facilitated by the fact that O-ring 345 is made of a material with a low coefficient of friction (Teflon TM in a currently preferred embodiment) so that ball cage 302 rotates easily on it. In a currently preferred embodiment ball cage 302, is rotated a small amount (approximately 9 mils in a currently preferred embodiment) after each resetting of the ball cage (e.g., each wafer). In order to accomplish 9 mils of rotation, shaft 301 must be rotated a small amount greater than 9 mils, as some movement is lost when O-ring 340 engages cage 302. It will be appreciated that the exact amount of rotation after each wafer is not critical. After the ball cage 302 has been rotated, shaft 301 is raised vertically to disengage O-ring 340 from screws 350 and ball cage 302, and is rotated back to its original position. Although this rotational reset does not necessarily need to be performed after each wafer, this is a convenient time to do so. Therefore, over time, the balls 305 will generally ride evenly over all portions of shaft 301. This is important, because as mentioned previously, in the interference fit areas, i.e. when balls 305 are adjacent to regions 301b, some wear of the shaft does occur due to the tight compression of the materials and the stresses imposed on the assembly 300 during probing. However, the theta adjustment provides for even wear over 360° of the working area of the shaft 301. It has been found that this theta adjustment provides for approximately an order of magnitude improvement in lifetime of assembly 300. Note that it is possible to reset the ball cage 302 relative to shaft 301 and housing 303 due to the fact that there is a clearance fit when the assembly 300 is in the position shown in FIG. 3. In assembly 200 of FIG. 2, this would not be possible, since the ball cage 202 will always track the movement of shaft 201, and the relative position would be unchanged when the platform 216 is returned to its operating position.

As described previously the interference fit (preload) is designed to provide for maximum stiffness without undue wear. In determining the amount of preload, reference may be had to balls on diametrically opposite sides of the assembly, for example, the left and right sides of the view shown in FIGS. 3–7. Referring to the dimensions given earlier, it can be determined that the combined diameter of the shaft in regions 301b plus two times the diameter of the selected balls 305 is 0.0005 inch (0.5 mil) greater than the inside diameter of housing 303. There is therefore a total preload of 0.5 mils, or 0.25 mil per side, in the regions 301b. In order to maintain the desired preload, the tolerances of these dimensions need to be controlled to a sufficient degree. This is made easier by the selection of sizes for balls 305 as described below. In a currently preferred embodiment, the inside diameter of housing 303 is controlled to a tolerance of approximately ±0.1 mil, and the diameter of shaft 301b is controlled to a tolerance of approximately ±0.1 mil. Also in a currently preferred embodiment, the balls 305 are grade 25, which means that their dimension is controlled to 25 millionths of an inch (0.025 mil). As mentioned previously, the size of balls 305 is selected from one of 0.1874 inch, 0.1875 inch or 0.1876 inch for a given assembly 300. In a currently preferred embodiment the housing 303 and shaft 301 are measured, and the ball 305 size which will result in a preload of or close to 0.5 mil is used. For example, if the measured diameter of the shaft 301 is 1.6227 inch, and the measured inner diameter of housing 303 is 1.9974 inch, the 0.1876 inch size balls 305 will be used to give a 0.5 mil preload. As will be readily appreciated, the dimensions of the various parts of ball bearing assembly 300, the optimal preload, and the acceptable tolerances will depend upon the requirements of the user, including the use to which ball bearing assembly 300 will be put, desired cost, quality, life span, etc., and may be varied from the above.

The above dimensions and preload are at room temperature. As is well known, the materials used in constructing the ball bearing assembly expand with increasing temperature. Therefore, the above dimensions will change at different temperatures. In some applications, such as in the probing application described herein, there may be temperature changes to which the assembly is subjected. Furthermore, these temperature changes may not be uniform throughout the assembly. As described earlier, platform 320 may be heated to approximately 200° C. or more. Since there is thermal insulation between the platform 320 and shaft 301, shaft 301 does not reach the same temperature as platform 320. However, when platform 320 is heated to 200° C., shaft 301 can reach temperatures as high as approximately 50° C. near the balls 305. However, housing 303 typically rises only to approximately 35° C. in this region. Thus, without the teachings of the present invention as described below, the optimized interference fit may be outside of a specified range, for example, shaft 301 may expand more than the inner surface of housing 303, thereby leading to increased preload.

In the present invention, this effect is overcome by choosing materials such that the product of the coefficient of thermal expansion times the expected temperature change is nearly equal for both the housing and the shaft. Specifically shaft 301 is made of material with a lower coefficient of thermal expansion than housing 303, since shaft 301 reaches a higher temperature than housing 303. In the currently preferred embodiment, housing 303 is made of A356 aluminum. Shaft 301 is made of 440C stainless steel. Housing 303 has a thin (approximately 40 mils thick) sleeve of 440C stainless steel in the regions the balls 305 contact housing 303 in order to provide a hard surface for balls 305 to roll against. However, the expansion of housing 303 is driven by the aluminum material which forms the far greater portion of housing 303. Also in a currently preferred embodiment, balls 305 are made of 440C stainless steel. The balls 305, the sleeves on housing 303, and shaft 301 are hardened to Rockwell C58 minimum.

In a currently preferred embodiment, a preload 0.42 mil (0.0042 inches) is desired during operation. As mentioned above, the preload of 0.5 mil is set at room temperature. However, under normal operation, without a hot platform 320, the entire assembly reaches a temperature of approximately 30° C. This increase in temperature reduces the preload to approximately the desired 0.42 mil, or 0.21 mil per side. When a hot platform is used, the shaft 301 reaches a higher temperature (approximately 50° C.) than the housing 303 (approximately 35° C.). Without any adjustment to the materials, the preload would increase greatly under these circumstances. However, with the temperatures for the shaft 301, and housing 303 given above, and with the dimensions and materials described above, the preload increases only to approximately 0.447 mil, which is acceptable.

As will be readily appreciated, many modifications can be made to the embodiment shown herein, within the scope of the present invention. As mentioned earlier, assembly 301 can be used in many applications in addition to carrying a platform as described herein. Additionally, the number and arrangement of balls 305 can be varied from the embodiment described herein. As a first example, additional rings of balls such as 305a and 305b, with an additional region 301a and 301b on shaft 301 for each ring, could be utilized. As with the embodiment shown in FIG. 3, the additional ring or rings should engage section 301b of the shaft at approximately the same time. The additional rings may be useful in providing additional stiffness and control. As a second example, two rings of balls could be present where one ring is shown in FIG. 3. For example, another ring of balls could be placed directly above the ring as 305a, and/or ring 305b. Again this would provide for greater stiffness and control. However, in order to provide for the required interference stroke range, the Z travel of the platform should be greater, to allow all balls to be within the interference stroke range 331 when probing.

In other alternative embodiments of the invention, housing 303 moves and shaft 301 is stationary, or as a further embodiment shaft 301 and housing 303 move reciprocally. In a further alternative embodiment, shaft 301 has a uniform diameter, and the interference and clearance fits are obtained by having regions in housing 303 of different inside diameter. Also, as mentioned earlier, numerous other configurations, besides the cylindrical shaft and housing described herein could be utilized in accordance with the present invention. All that is necessary is a region of interference fit in the region of travel where stiffness is required, and a region of clearance fit allowing for resetting of the cage with respect to the shaft. Means other than O-ring 340 and O-ring 345 as described herein could be used to reset the cage 302 upon reloading the wafer. For example, in other applications, shaft 301 or housing 303 could be positioned at a predetermined location, and some other independent means could be used to push or pull cage 302 to the relative location shown in FIG. 3. The embodiment described herein has the advantage that it allows for resetting both laterally and rotationally within the normal operation for which ball bearing assembly 300 is used.

Thus, a novel ball bearing assembly has been described. The invented ball bearing allows for maximum stiffness in a certain predefined stroke region. The ball cage of the present invention can be reset during use, such that detrimental sliding over the balls does not occur, and such that interference fit is maintained in the desired stroke range. Additionally, a rotational resetting is provided for allowing for increased lifetime of the assembly. Finally, the present invention provides for an optimized interference fit over an extended temperature range, wherein the temperature of the shaft may be different from the temperature of the housing during use.

What is claimed is:

1. A ball bearing assembly comprising:
   a housing;
   a shaft disposed in said housing;
   retaining means for retaining balls, said retaining means disposed between said shaft and said housing;
   a plurality of balls disposed in said retaining means;
   wherein said ball bearing assembly has a total stroke range of said shaft relative to said housing comprising a first stroke range and a second stroke range, said first stroke range having a clearance fit, and said second stroke range having an interference fit.

2. The ball bearing assembly as described in claim 1 further comprising resetting means for resetting the position of said retaining means relative to said shaft and said housing along the direction of travel to a reset position, such that said first stroke range and said second stroke range are reset to a predetermined range of distances.

3. The ball bearing assembly as described in claim 2 wherein said shaft and said housing are generally cylindrical, and said ball bearing assembly further comprises rotational resetting means for rotationally resetting said retaining means, said rotationally resetting means comprising rotational engaging means for engaging said retaining means, said rotational engaging means coupled to said shaft such that when said rotational engaging means engage said retaining means in said first stroke range, said retaining means can be rotated a predetermined amount when said shaft is rotated.

4. The ball bearing assembly as described in claim 2 wherein said resetting means comprise:
   first engaging means for engaging said retaining means at a first end of said total stroke range such that if said retaining means has migrated toward said first end, said first engaging means maintain said retaining means at or near said reset position while said ball bearing assembly returns to said reset position; and,
   second engaging means for engaging said retaining means at a second end of said total stroke range, such that if said retaining means has migrated toward said second end and if said retaining means does not move toward said reset position as said ball bearing assembly moves toward said reset position, said second engaging means engage said retaining means and move said retaining means to said reset position while said ball bearing assembly returns to said reset position, such that said retaining means is in said reset position when said housing and said shaft are in said reset position.

5. The ball bearing assembly as described in claim 4 wherein said shaft and said housing are generally cylindrical, and said ball bearing assembly further comprises rotational resetting means for rotationally resetting said retaining means, said rotationally resetting means comprising rotational engaging means for engaging said retaining means, said rotational engaging means coupled to said shaft such that when said rotational engaging means engage said retaining means in said first stroke range, said retaining means can be rotated a predetermined amount when said shaft is rotated.

6. The ball bearing assembly as described in claim 2 herein said shaft comprises a first material having a first coefficient of thermal expansion, said housing comprises a second material having a second coefficient of thermal expansion, said first and said second materials selected such that said interference fit remains in a predetermined range over a first operating temperature range of said shaft and a second operating temperature range of said housing.

7. The ball bearing assembly as described in claim 1 wherein said shaft and said housing are generally cylindrical, and said ball bearing assembly further comprises rotational resetting means for rotationally resetting said retaining means, said rotationally resetting means comprising rotational engaging means for engaging said retaining means, said rotational engaging means coupled to said shaft such that when said rotational engaging means engage said retaining means in said first stroke range, said retaining means can be rotated a predetermined amount when said shaft is rotated.

8. The ball bearing assembly as described in claim 1 wherein said shaft comprises a first material having a first coefficient of thermal expansion, said housing comprises a second material having a second coefficient of thermal expansion, said first and said second materials selected such that said interference fit remains in a predetermined range over a first operating temperature range of said shaft and a second operating temperature range of said housing.

9. The ball bearing assembly as described in claim 8 wherein said first operating temperature is approximately 25°–50° C., said second operating temperature range is approximately 25°–35° C., and wherein said housing comprises aluminum and said shaft comprises stainless steel.

10. A ball bearing assembly comprising:
    retaining means for retaining a plurality of balls, said balls having a diameter;
    a shaft;
    a housing, wherein said retaining means comprising said plurality of balls is disposed between said shaft and said housing, wherein said housing is spaced from said shaft along a length, there being at least one first region and at least one second region along said length, wherein in said first region said shaft is spaced a first distance from said housing, said first distance being greater than said diameter of said balls, and wherein in said second regions said shaft is spaced a second distance from said shaft, said second distance being less than said diameter of said balls, wherein said ball bearing assembly has a clearance stroke range when said plurality of balls are between said shaft and said housing in said first region, and said ball bearing assembly has an interference stroke range when at least some of said plurality of balls are between said shaft and said housing in said second region.

11. The ball bearing assembly as described in claim 10 further comprising resetting means for resetting the position of said retaining means relative to said shaft and said housing along the direction of travel to a reset position, such that said first stroke range and said second stroke range are reset to a predetermined range of distances.

12. The ball bearing assembly as described in claim 11 wherein said shaft and said housing are generally cylindrical, and said ball bearing assembly further comprises rotational resetting means for rotationally resetting said retaining means, said rotationally resetting means comprising rotational engaging means for engaging said retaining means, said rotational engaging means coupled to said shaft such that when said rotational engaging means engage said retaining means in said clearance stroke range, said retaining means can be rotated a predetermined amount when said shaft is rotated.

13. The ball bearing assembly as described in claim 11 wherein said resetting means comprise:
- first engaging means for engaging said retaining means at a first end of said total stroke range such that if said retaining means has migrated toward said first end, said first engaging means maintain said retaining means at or near said reset position while said ball bearing assembly returns to said reset position; and,
- second engaging means for engaging said retaining means at a second end of said total stroke range, such that if said retaining means has migrated toward said second end and if said retaining means does not move toward said reset position as said ball bearing assembly moves toward said reset position, said second engaging means engage said retaining means and move said retaining means to said reset position while said ball bearing assembly returns to said reset position, such that said retaining means is in said reset position when said housing and said shaft are in said reset position.

14. The ball bearing assembly as described in claim 13 wherein said shaft and said housing are generally cylindrical, and said ball bearing assembly further comprises rotational resetting means for rotationally resetting said retaining means, said rotationally resetting means comprising rotational engaging means for engaging said retaining means, said rotational engaging means coupled to said shaft such that when said rotational engaging means engage said retaining means in said clearance stroke range, said retaining means can be rotated a predetermined amount when said shaft is rotated.

15. The ball bearing assembly as described in claim 10 wherein said shaft and said housing are generally cylindrical, and said ball bearing assembly further comprises rotational resetting means for rotationally resetting said retaining means, said rotationally resetting means comprising rotational engaging means for engaging said retaining means, said rotational engaging means coupled to said shaft such that when said rotational engaging means engage said retaining means in said clearance stroke range, said retaining means can be rotated a predetermined amount when said shaft is rotated.

16. The ball bearing assembly as described in claim 10 wherein said shaft comprises a first material having a first coefficient of thermal expansion, said housing comprises a second material having a second coefficient of thermal expansion, said first and said second materials selected such that said interference fit remains in a predetermined range over a first operating temperature range of said shaft and a second operating temperature range of said housing.

* * * * *